(12) United States Patent
Westphal et al.

(10) Patent No.: US 11,463,791 B2
(45) Date of Patent: Oct. 4, 2022

(54) COMMUNICATION MODULE FOR CAPTURING CONSUMPTION DATA FROM A METER

(71) Applicant: Diehl Metering Systems GmbH, Nuremberg (DE)

(72) Inventors: Robert Westphal, Wangen (DE); Philippe Vorburger, Sausheim (DE); Joerg Feuchtmeier, Oberasbach (DE); Roland Gottschalk, Schwabach (DE); Klaus Gottschalk, Winkelhaid (DE)

(73) Assignee: Diehl Metering Systems GmbH, Nuremberg (DE)

( * ) Notice: Subject to any disclaimer, the term of this patent is extended or adjusted under 35 U.S.C. 154(b) by 0 days.

(21) Appl. No.: 16/720,392

(22) Filed: Dec. 19, 2019

(65) Prior Publication Data

US 2020/0128308 A1    Apr. 23, 2020

Related U.S. Application Data

(63) Continuation of application No. PCT/EP2018/000311, filed on Jun. 20, 2018.

(30) Foreign Application Priority Data

Jun. 29, 2017 (DE) .......................... 102017006506.3

(51) Int. Cl.
*H04Q 9/14* (2006.01)
*H02J 50/10* (2016.01)
(Continued)

(52) U.S. Cl.
CPC .............. *H04Q 9/14* (2013.01); *G01D 4/004* (2013.01); *G01R 22/063* (2013.01); *H02J 50/10* (2016.02);
(Continued)

(58) Field of Classification Search
CPC .. H04Q 9/14; H04Q 2209/43; H04Q 2209/60; H02J 50/10; G01D 4/004; G01R 22/063
See application file for complete search history.

(56) References Cited

U.S. PATENT DOCUMENTS

| 6,424,270 B1 * | 7/2002 | Ali ......................... H04Q 9/04 340/870.02 |
| 2002/0082748 A1 * | 6/2002 | Enga ..................... G01D 4/004 700/291 |

(Continued)

FOREIGN PATENT DOCUMENTS

| DE | 10126816 A1 | 1/2003 |
| DE | 202007017510 U1 | 4/2008 |

(Continued)

*Primary Examiner* — Amine Benlagsir
(74) *Attorney, Agent, or Firm* — Laurence A. Greenberg; Werner H. Stemer; Ralph E. Locher

(57) ABSTRACT

A communication module acquires consumption data from a meter, in particular consumption quantities of electricity, gas, water or heat. The communication module serves to receive consumption data from the meter and to enable the transmission of the consumption data of the meter to a superordinate data collection device. The module has a housing, a control apparatus, its own energy source, an antenna, a first communication interface using which the consumption data can be transmitted from the meter to the communication module, and a second communication interface using which the consumption data can be further transmitted from the communication module to the data collection device. The first communication interface is a standardized close-range interface which supports a plurality of standardized transmission protocols as options and/or the second communication interface is a standardized long-range interface which supports a plurality of standardized transmission protocols as options.

7 Claims, 6 Drawing Sheets

(51) Int. Cl.
*G01D 4/00* (2006.01)
*G01R 22/06* (2006.01)

(52) U.S. Cl.
CPC ..... *H04Q 2209/43* (2013.01); *H04Q 2209/60* (2013.01)

(56) References Cited

U.S. PATENT DOCUMENTS

| | | | |
|---|---|---|---|
| 2003/0009301 A1 | 1/2003 | Anand et al. | |
| 2005/0270173 A1* | 12/2005 | Boaz | H04Q 9/00 340/870.02 |
| 2008/0106434 A1* | 5/2008 | Winter | G01D 4/006 340/870.2 |
| 2009/0073070 A1* | 3/2009 | Rofougaran | H04B 5/0012 343/793 |
| 2010/0299452 A1* | 11/2010 | Flammer | H04L 45/00 709/241 |
| 2011/0066297 A1* | 3/2011 | Saberi | F16K 31/046 700/287 |
| 2012/0163213 A1 | 6/2012 | Sanderford, Jr. | |
| 2012/0225687 A1* | 9/2012 | Norair | H04L 1/0083 455/522 |
| 2013/0095877 A1 | 4/2013 | Smith et al. | |
| 2015/0088442 A1* | 3/2015 | Farrar | G01D 4/004 702/62 |
| 2016/0274609 A1* | 9/2016 | Siddall | G05B 15/02 |
| 2017/0006141 A1* | 1/2017 | Bhadra | H04W 84/18 |
| 2017/0085966 A1* | 3/2017 | Berkcan | G01F 15/075 |
| 2017/0223720 A1* | 8/2017 | Li | H04W 72/0453 |
| 2017/0280460 A1* | 9/2017 | Emmanuel | H04W 72/0446 |
| 2018/0063851 A1* | 3/2018 | Abraham | H04W 72/06 |

FOREIGN PATENT DOCUMENTS

| | | |
|---|---|---|
| DE | 102005051159 B4 | 8/2011 |
| WO | 2008122408 A2 | 10/2008 |
| WO | 2015184161 A1 | 12/2015 |

* cited by examiner

COMMUNICATION MODULE FOR CAPTURING CONSUMPTION DATA FROM A METER

CROSS-REFERENCE TO RELATED APPLICATION

This is a continuation application, under 35 U.S.C. § 120, of copending international application No. PCT/EP2018/000311, filed Jun. 20, 2018, which designated the United States; this application also claims the priority, under 35 U.S.C. § 119, of German patent application No. DE 10 2017 006 506.3, filed Jun. 29, 2017; the prior applications are herewith incorporated by reference in their entirety.

The present invention relates to a communication module for the acquisition of consumption data from a meter, in particular from an electricity, gas, water or heat meter according to the preamble of the independent claim.

BACKGROUND OF THE INVENTION

Field of the Invention

Intelligent consumption meters, also known as smart meters, are consumption measuring instruments found in supply networks, e.g. for energy, electricity, gas or water, which display the actual consumption to the respective connection user and are integrated into a communication network. Intelligent consumption meters have the advantage that manual readings of the meters are not required, and that the supplier can prepare invoices at shorter notice in accordance with the actual consumption. Through shorter intervals between the readings, the tariffs to the end customer can in turn be more accurately coupled to the development of prices on the electricity market. Supply networks can also be significantly better utilized.

Intelligent consumption meters are usually each associated with residential units or residential houses. The measurement data or information that accrue there can be read in very different ways. They can, for example, be read over the electricity network (power line) or using wireless technology (e.g. mobile telephony, in the ISM (industrial, scientific, medical) band frequency range, or the like) in the form of data packets or telegrams. The information can, furthermore, be linked through this into a supra-local network.

Communication modules, which are integrated or installed in the consumption meters, are expediently assigned to the consumption meters for the wireless transmission of the information. Such communication modules usually have a fixed preinstalled transmitting and receiving unit, as well as an antenna for transmitting and receiving the information. The transmitting and receiving unit is preconfigured at the factory in such a way that it is fitted with the preferred wireless technology or the preferred transmission protocol, i.e. that it can transmit and receive with them.

Furthermore, different consumption meters, or the manufacturers of the consumption meters, use different transmission protocols for the information transmission. In addition, these transmission protocols develop further, or new and improved transmission protocols come onto the market, so that the communication modules of the consumption meters must be updated more often.

A communication module for insertion into a meter is known from German patent DE 10 2005 051 159 B4, wherein the meter contains a measuring apparatus that serves to ascertain an information value specific to the meter type regarding a liquid or gaseous medium flowing in a line. The communication module contains a standardized housing adjusted in shape in accordance with a standardized recess shape of the meter. When operating, the communication module communicates with the measuring apparatus, wherein a standardized control apparatus is provided, configurable for the specific meter type, with associated transmission means for transmitting the information values specific to the meter type to an external acquisition apparatus. The measuring apparatus and the communication module here communicate over a standardized, wireless communication interface which preferably is a capacitive interface. The disadvantage of this communication module is that it is only possible to connect meters that contain a specific capacitive interface as well as an appropriately designed housing, which means that an individual communication module is required for the respective meter. The scope for the application of the communication module is accordingly inflexible.

SUMMARY OF THE INVENTION

The object of the present invention is that of providing an economical communication module which can be connected flexibly and in a simple manner to a meter and with which the transmission quality and transmission range are improved.

The above object is achieved through the full teaching of the independent claim. Expedient embodiments of the invention are claimed in the subsidiary claims.

According to the invention, the first communication interface of the communication module is an in particular standardized close-range interface for wireless connection of the meter which supports a plurality of in particular standardized transmission protocols as options. The second communication interface, in contrast, is an in particular standardized long-range interface which correspondingly also supports a plurality of in particular standardized transmission protocols as options in particular for remote data transmission. The communication module, or the user, thereby has the option of choosing between transmission protocols for data transmission. For example, different meters that support different transmission protocols can be connected in a simple manner to one and the same communication module, in that the transmission protocol required in each case for the connection is selected by the user or automatically by the communication module. It is further possible to choose between different transmission protocols for the long-range communication in order to communicate with data loggers, control centers or the like over different transmission protocols. A flexible and economical connection facility is thus provided by the communication module according to the invention, through which communication between units communicating over different transmission protocols, such as meters, data loggers, communication modules from different manufacturers or the like, is made possible, meaning that the communication module also has a type of translating function. The data transmission of different meters to a data concentrator can be unified through this in an easy manner. The transmission protocol can, furthermore, be adapted to the respective transmission situation in the light of the necessary transmission quality and transmission range of the data transmission, so that both the transmission quality and the transmission range are improved to a significant degree.

Preferably either a single antenna is provided for communication using the first and the second communication interface, or a first antenna is provided for communication using the first communication interface and a second antenna for communication using the second communication interface.

The first communication interface can expediently comprise at least two transmission protocols from the following group: Near Field Communication (NFC), infrared (Infrared Data Association, IrDA), Bluetooth, Bluetooth Low Energy (BLE), Open Metering System (OMS) and inductive transmission. A reliable and energy-saving close-range communication can be achieved hereby.

A third communication interface can furthermore be provided using which the consumption data can be transmitted from the meter to the communication module. Alternative transmission facilities or transmission protocols can, for example, be adapted using the third communication interface.

The third communication interface is preferably an in particular non-standardized close-range and/or in particular non-standardized long-range interface that supports at least one or, optionally, a plurality of in particular non-standardized transmission protocols. A manufacturer's proprietary transmission protocol can, for example, be implemented in this way in order to integrate the communication module into, for example, a proprietary communication network with its own security and transmission standards. The transmission quality and data security can be improved to a significant degree thereby.

The antenna(s) can expediently be antenna(s) integrated into the communication module. In this way the communication module can be designed in a particularly space-saving manner, in that the antenna(s) is/are adapted individually to the available space.

It is furthermore also possible for a plurality of antennas to be provided for the respective transmission facilities, e.g. for close-range and for long-range transmission. The antenna for long-range transmission can, for example, be a PIF antenna (planar inverted F-shaped antenna) which can, for example, be integrated directly onto a control board of the communication module. The resonance point can here be designed in such a way that the respective antenna is used for only one frequency band or also for a plurality of frequency bands in order, for example, to be able to transmit at the typical resonance frequencies at 800-900 MHz (e.g. ISM bands in the range from 868-873 MHz) and in addition also at 2.4 GHz (WLAN). For close-range transmission (e.g. at 13.56 MHz), a magnetic-inductive antenna such as an RFID transponder can furthermore also be provided.

The communication module can comprise means for specifying the respective transmission protocol. The communication module can, for example, comprise as means a detection function that is configured to query all the supported transmission protocols, wireless standards, wireless systems or the like step-by-step, and to search for a response signal in order, for example, to identify the transmission standard or transmission protocol over which the device or meter that is to be connected can communicate. This transmission standard can then be selected, preferably automatically, to connect to the meter.

Alternatively or in addition an interference detection function can also be provided, through which the specification of the transmission type is performed so that, for example, the frequency channels and/or transmission protocols with the best possible transmission properties are selected. The transmission quality and transmission security are improved to a significant degree thereby.

A data memory for storing the consumption data can expediently be provided. The consumption data can also be stored over a longer period of time with this, so that, for example, a transmission of the consumption data can take place at a later point in time even in the presence of persistent interference. Data losses resulting from inadequate storage capacities can in this way be avoided.

The communication module is furthermore preferably configured to communicate with a plurality of meters and/or superordinate data collection apparatuses and/or communication modules. A plurality of different meters can, for example, also be connected using a communication module, e.g. gas, water, heat and electricity meters. These types of meter can thereby be connected using the communication module to a smart home controller. The smart home controller requires a communication device for this connection which can, for example, only communicate using one of the transmission protocols implemented in the communication module. Meters that only support wireless technologies which, on the other hand, the smart home controller does not support can in this way also be connected in a simple manner using the communication module to the smart home controller. The ability to retrofit new kinds of meter, as well as the implementation of new transmission standards into existing technologies such as, for example, smart home controllers, are hereby made significantly easier. The communication module can, furthermore, also communicate with other participants of the smart home controller in order to integrate these.

According to one particular embodiment, the communication module can also be configured to supply the meter with energy using one of the communication interfaces. This can, for example, take place over a wireless NFC charging system, in particular using the means of communication (e.g. antenna) of the first communication interface.

Other features which are considered as characteristic for the invention are set forth in the appended claims.

Although the invention is illustrated and described herein as embodied in a communication module for capturing consumption data from a meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

Figure 4A:
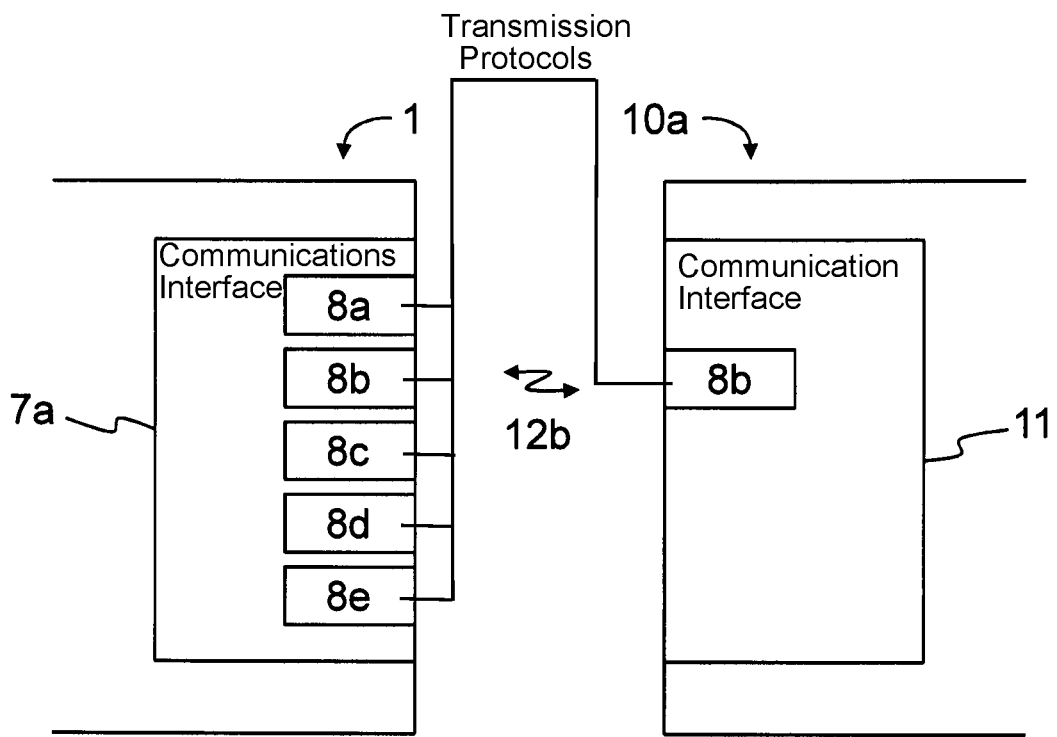
Figure 4B:
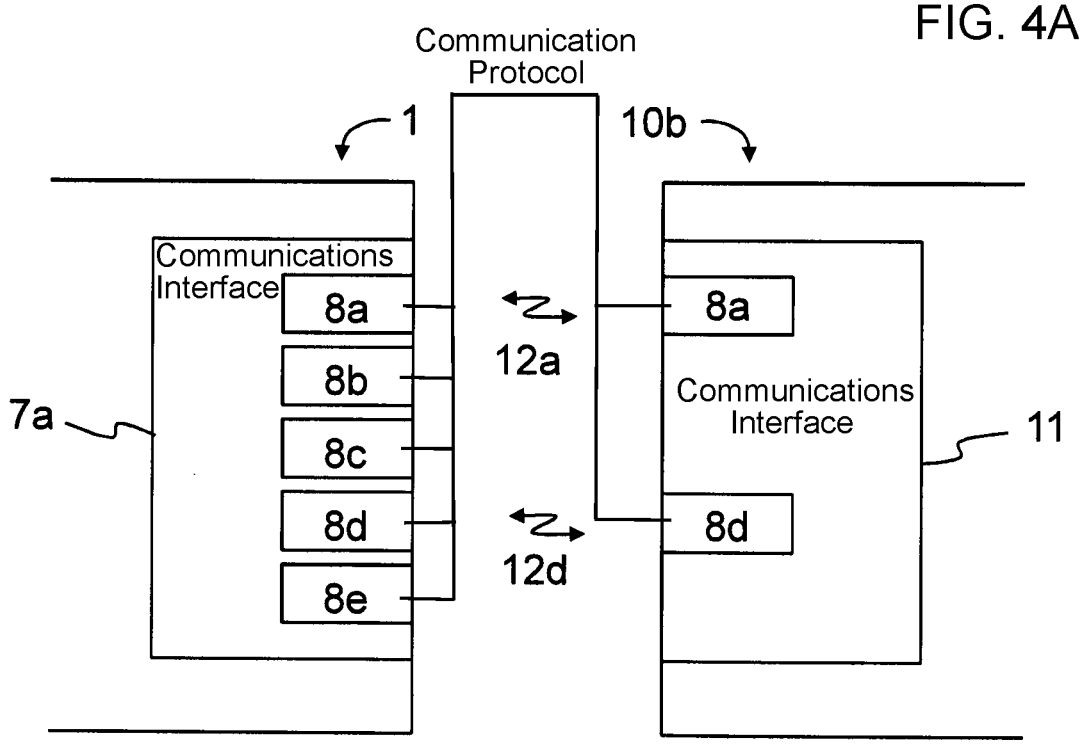

FIG. 4A is a highly simplified, schematic illustration of the first communication interface of the communication module according to the invention with a connected communication interface of a meter; and FIG. 4B is a highly simplified, schematic illustration of the first communication interface of the communication module according to the invention with a connected communication interface of a meter.

DETAILED DESCRIPTION OF THE INVENTION

Figure 1A:
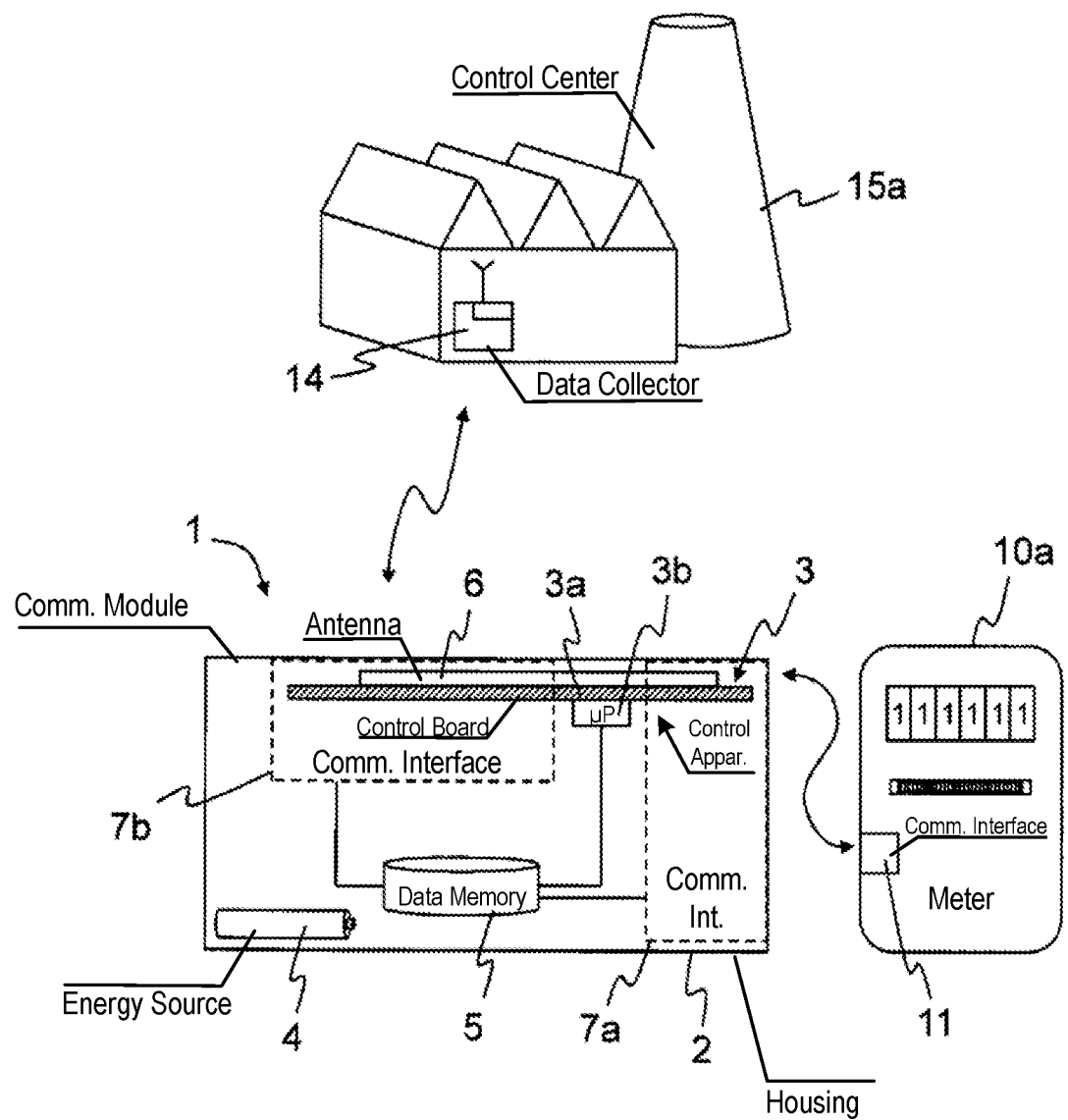
FIG. 1A is a highly simplified, schematic illustration showing an embodiment of a communication module according to the invention.

The following is a summary list of reference numerals and the corresponding structure used in the above description of the invention. Reference sign 1 in FIG. 1A refers to a variant embodiment of a communication module according to the invention. The communication module 1 contains a housing 2, a control apparatus 3, and its own energy source 4 such as, for example, an accumulator or a battery. The control apparatus 3 is configured as a control board 3a which contains a microprocessor 3b which serves primarily to control the communication module 1. The communication module 1 additionally contains a data memory 5 for data storage which the control apparatus 3 can access. The communication module has an antenna 6 that is configured as a PCB antenna (printed circuit board antenna) arranged on the control board 3a and which is suitable for close-range and long-range communication.

The communication module 1 further contains a communication interface 7a that is configured as a standardized close-range interface, and a communication interface 7b that is configured as a standardized long-range interface. The communication interface 7a is configured to enable a wireless connection to a meter 10a in order, for example, to acquire the consumption data of the meter 10a. The meter 10a also contains a communication interface 11 for consumption data transmission for this purpose. The consumption data are here received from the communication module 1 using the communication interface 7a and for example stored temporarily in the data memory 5. The consumption data can then be taken from the data memory 5 and transmitted by the communication interface 7b to a superordinate data collection apparatus. As shown in FIG. 1, the data collection apparatus is, for example, a data collector 14 within a control center of the supplier 15a.

Figure 1B:
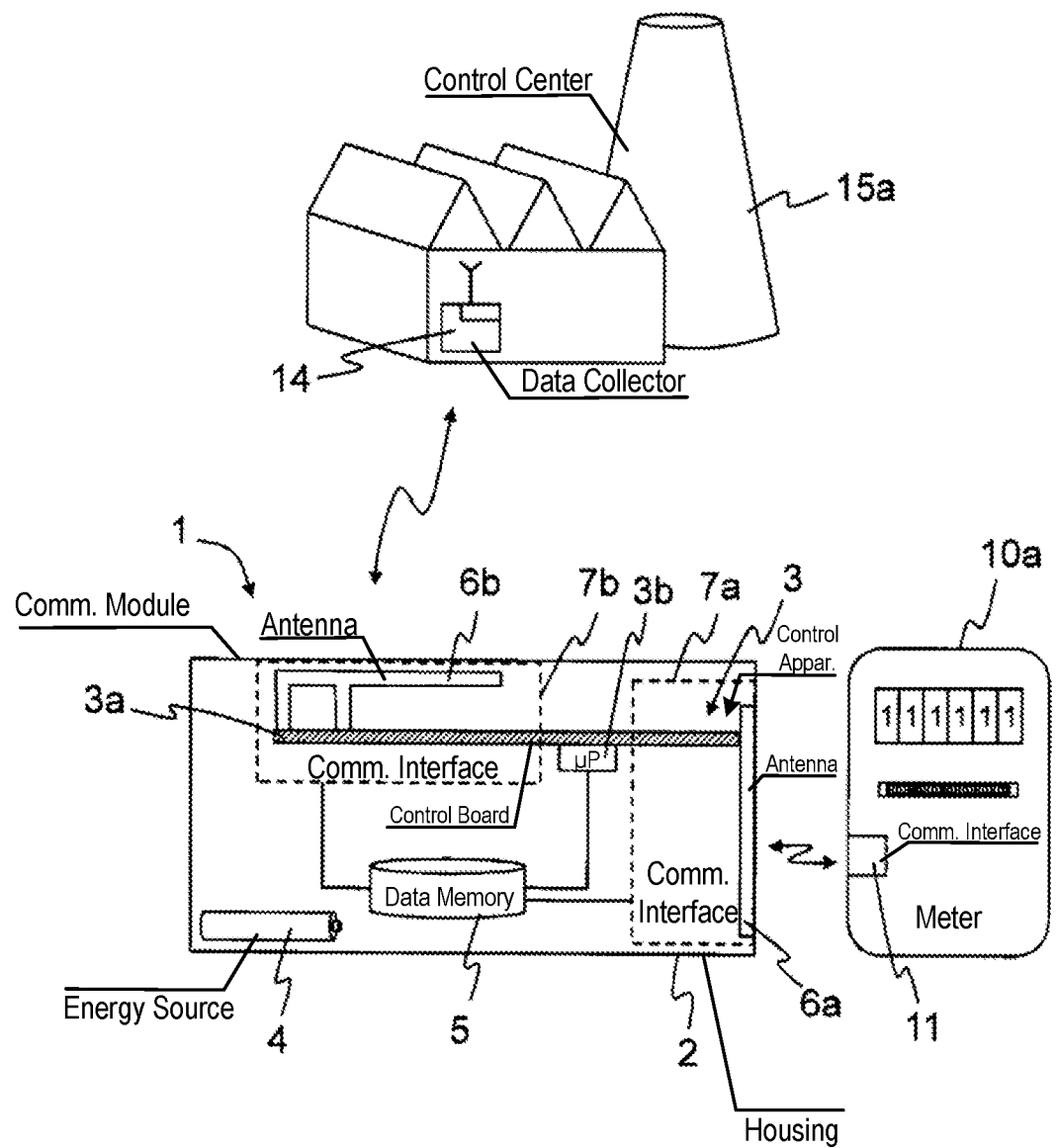
FIG. 1B is a highly simplified, schematic illustration showing a further embodiment of the communication module according to the invention.

According to one special embodiment according to FIG. 1B, the communication module 1 can also comprise multiple antennas 6a, 6b. The antennas 6a, 6b are expediently arranged directly at the control board 4a of the control apparatus 4, i.e. inside the housing 2. It is alternatively conceivable that the antennas 6a and/or 6b are at least partially integrated into the housing 2, i.e. in particular being glued or cast in. The antenna 6a serves for close-range transmission and is thus assigned to the first communication interface 7a. The antenna 6a can, for example, be a magnetic-inductive antenna 6a that is configured as a coil such as, for example, a foil antenna whose conductive structures are printed onto a foil. The antenna 6a here is arranged as close as possible to the housing 2 in order to ensure a good transmission quality. An antenna 6b is furthermore provided which is designed as a PIF antenna (planar inverted F-shaped antenna) and serves for long-range transmission, i.e. is assigned to the second communication interface 7b.

Figure 1C:
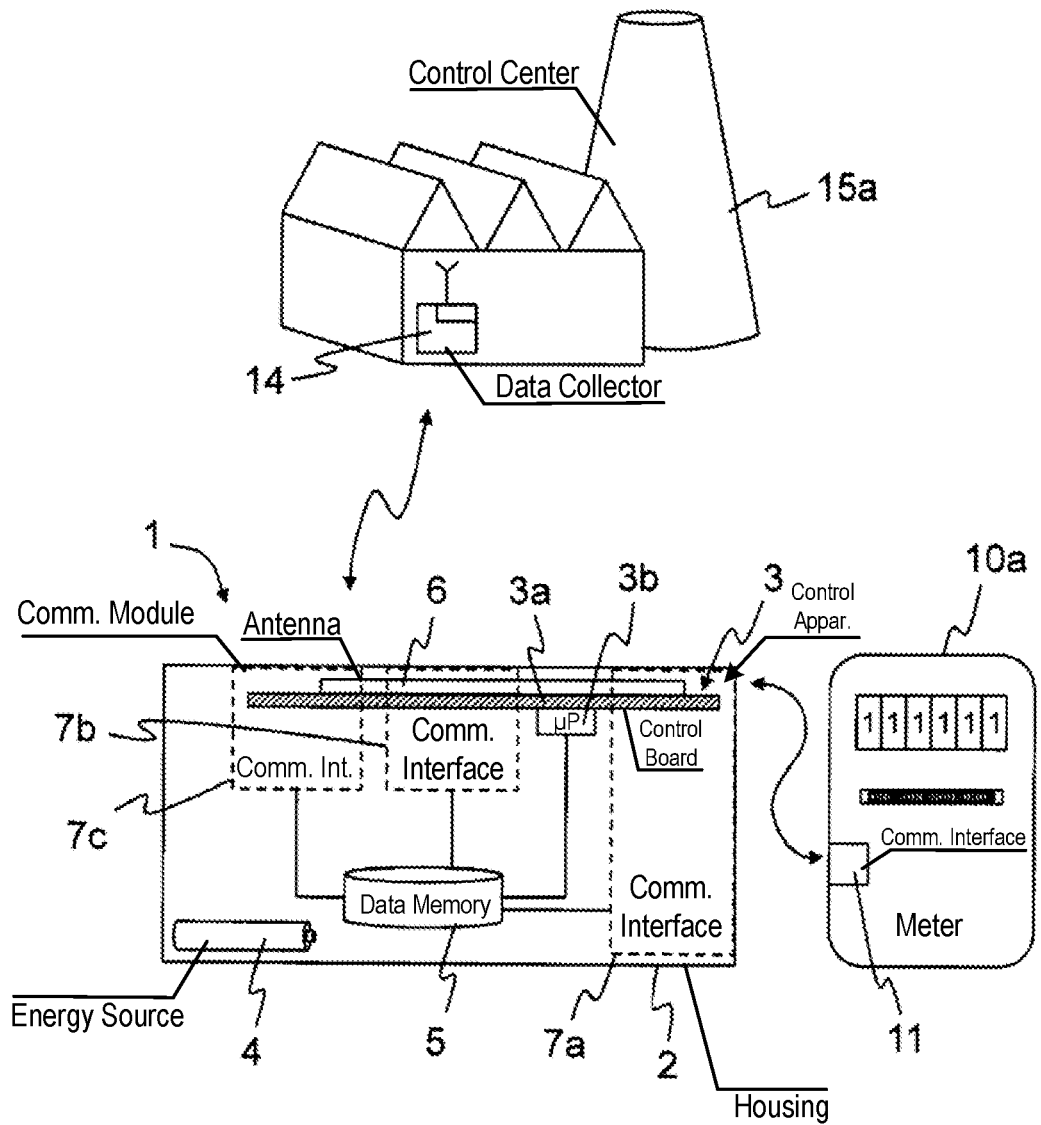
FIG. 1C is a highly simplified, schematic illustration showing a further embodiment of the communication module according to the invention.

The communication module 1 can also, as shown in FIG. 1C, comprise a third communication interface 7c as well as further communication interfaces not illustrated in the figures. The third communication interface 7c is, for example, a non-standardized close-range and/or non-standardized long-range interface through which the consumption data, e.g. from the meter 10a are transmitted to the communication module 1 or from the communication module 1 to the data collection apparatus using at least one or, optionally, a plurality of non-standardized transmission protocols.

Figure 2:
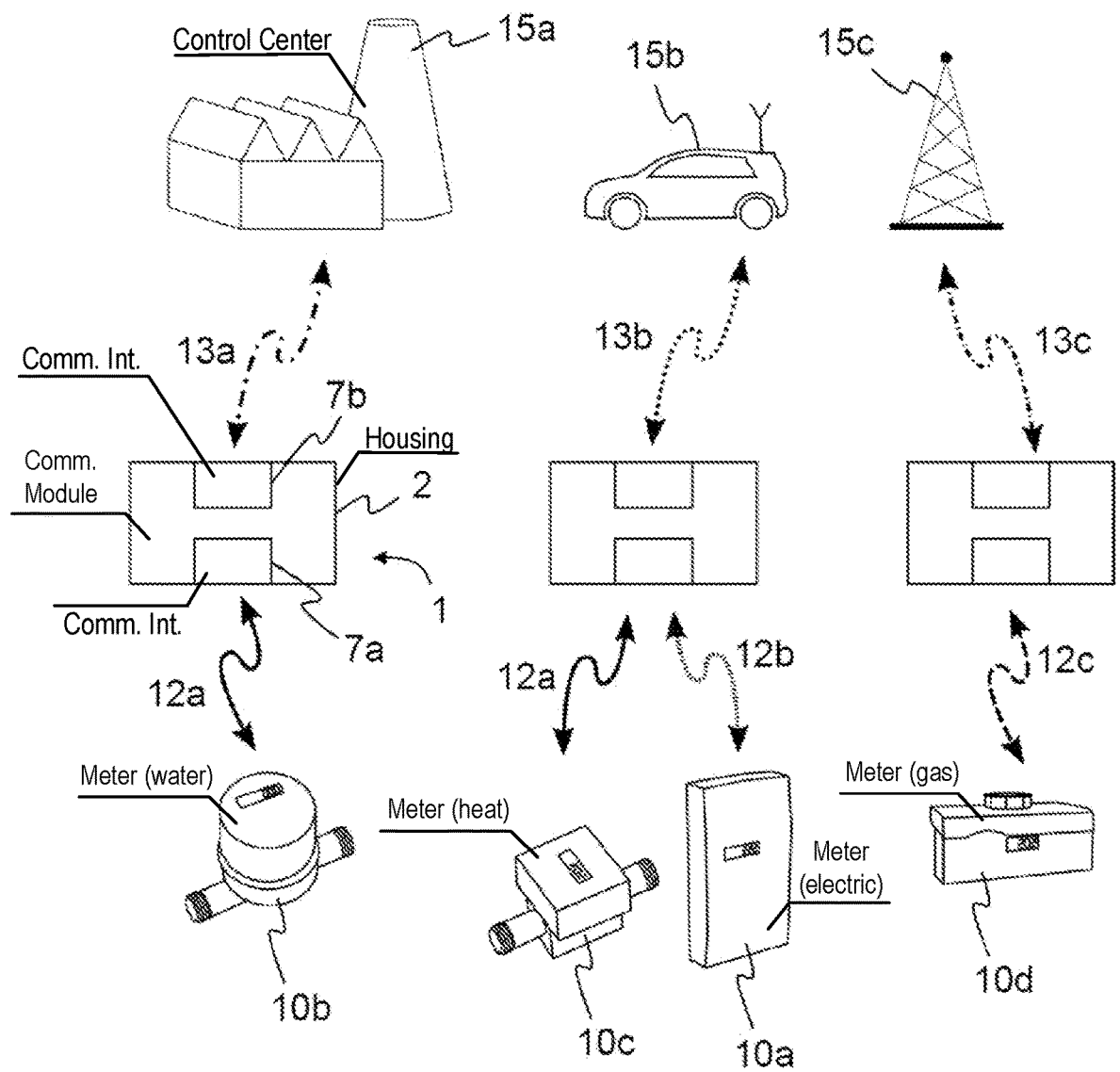
FIG. 2 is a highly simplified, schematic illustration of a communication system containing a plurality of communication modules.

In FIG. 2 a communication system is illustrated containing a plurality of external, autonomous communication modules 1 each of which is provided for connecting one or a plurality of meters for electricity 10a, water 10b, heat 10c or gas 10d to the communication system. The communication modules 1 each transmit the consumption data of the meters 10a, 10b, 10c, 10d to a superordinate data collection apparatus such as the control center of the supplier 15a, a mobile data collector 15b that is used, for example, with drive-by or walk-by readings, or a stationary concentrator 15c that is, for example, arranged at a node or set up within a household for connection of a smart home controller. The communication between the communication module 1 and the respective meter 10a, 10b, 10c, 10d or the respective data collection apparatus takes place using different transmission protocols. The communication using different transmission protocols is illustrated in FIG. 2 with reference to communication connections 12a-12c or 13a-13c shown with differently dashed lines.

Figure 3A:
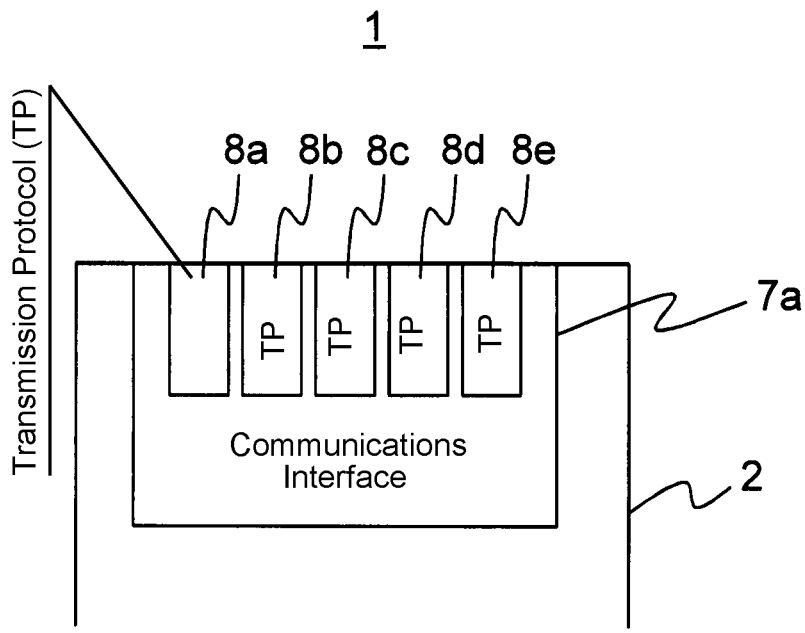
FIG. 3A is a highly simplified, schematic illustration of a first communication interface of the communication module according to the invention.
Figure 3B:
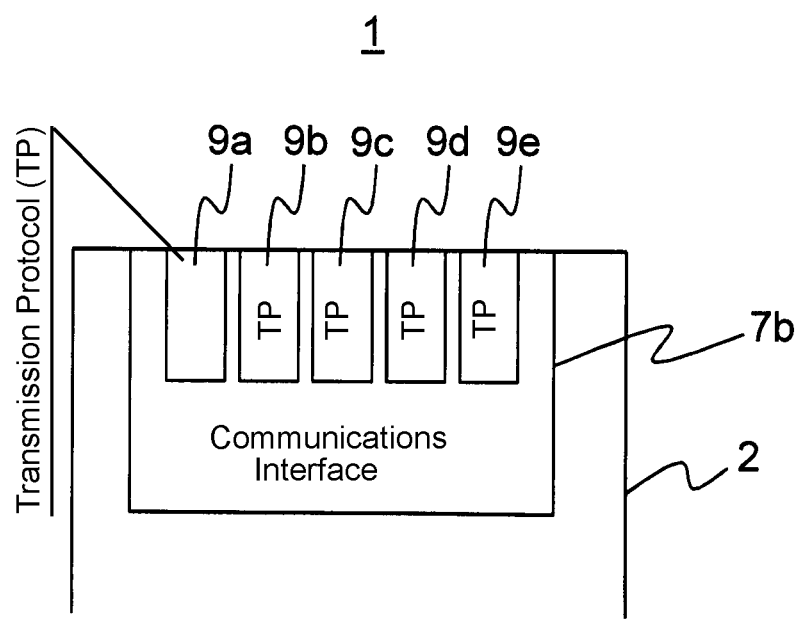
FIG. 3B is a highly simplified, schematic illustration of a second communication interface of the communication module according to the invention.

As shown in FIG. 3A, the communication interface 7a is configured for communication between the communication module 1 and meters 10a, 10b, 10c, 10d in such a way that the communication can optionally take place on the basis of a plurality of standardized transmission protocols 8a-8e, i.e. a plurality of transmission protocols 8a-8e are supported in parallel. In the same way, the second communication interface 7b, as shown in FIG. 3B, also supports a plurality of standardized transmission protocols 9a-9e using which transmission can optionally take place.

The first communication interface 7a can here preferably comprise at least two standardized transmission protocols 8a-8e, in particular from the following group: Near Field Communication (NFC), infrared (Infrared Data Association, IrDA), Bluetooth, Bluetooth Low Energy (BLE), Open Metering System (OMS) and/or inductive transmission. The second communication interface 7b can, in contrast, comprise transmission protocols 9a-9e in particular from the following group: radio standards for remote data transmission, mobile telephony standards (e.g. GSM, GPRS, 3G, 4G . . . ), wired communication (e.g. MBus, RS485 . . . ) through to Internet-of-Things applications (e.g. LoRa, SigFox, WLAN, NB-LTE . . . ).

The transmission facilities or transmission protocols constitute in particular a non-exhaustive list that can be extended in the context of the invention optionally by other transmission protocols known from the prior art.

The communication module 1 of FIG. 4A can, for example, communicate with the communication interface 11 of the electricity meter 10a. The communication interface 11 here supports the transmission protocol 8b, for example Bluetooth LE. The communication module 1 is configured here in such a way that this transmission protocol 8b is recognized, preferably automatically, by the communication module 1, e.g. by means of wireless or channel sampling, and the communication interface 7a is set up in such a way that the communication or the data transmission takes place using the transmission protocol 8b. The communication module 1 of FIG. 4B can, in contrast, communicate with the communication interface 11 of the electricity meter 10b. The communication interface 11 here supports the transmission protocol 8a as well as 8d, for example IrDA and NFC. After a recognition of the transmission protocols 8a or 8d, the communication module 1 can select the transmission protocol 8a or 8d and accordingly set up the communication interface 7a so that the communication or the data transmission takes place optionally using the transmission protocol 8a and/or 8d. The communication module 1 can, in addition, comprise an interference detection and/or a transmission protocol assessment function, with reference to which the transmission protocol 8a-8e that is best suited to the current transmission situation is selected.

In summary, the communication interface 11, in particular a standardized close-range interface of a smart meter (e.g. meter 10a, 10b, 10c, 10d) is used, through the communication module 1 according to the invention, to connect the communication module 1 wirelessly using a standardized close-range interface of the communication module 1 to the smart meter in order, for example, to transfer meter data or consumption data. The meter data are transmitted here with the aid of the appropriate integrated technology (or transmission protocols such as BLE, NFC, IrDA, inductive, OMS . . . ). The communication module 1 or the first communication interface 7a here supports a plurality of transmission protocols 8a-8e or 9a-9e which can be selected specifically for each meter. A separation between metrology and communication technology is accordingly achieved through the use of a communication module 1 according to the invention. The advantages of the invention are found here in particular in the flexibility of system design, the use of standardized technologies for the data communication, and, through displacing the communication to the outside, i.e. to an external communication module 1, an increase in the service life, flexibility and robustness of the smart meter in the field.

The content of the disclosure explicitly also comprises combinations of individual features (subsidiary combinations) as well as possible combinations of individual features of different forms of embodiment not shown in the drawings.

LIST OF REFERENCE SIGNS

1 Communication module
2 Housing
3 Control apparatus
3a Control board
3b Microprocessor
4 Energy source
5 Data memory
6 Antenna
6a Antenna
6b Antenna
7a Communication interface
7b Communication interface
7c Communication interface
8a-8e Standardized transmission protocol
9a-9e Standardized transmission protocol
10a Meter (electricity)
10b Meter (water)
10c Meter (heat)
10d Meter (gas)
11 Communication interface (meter)
12a-12e Communication connection
13a-13c Communication connection
14 Data collector
15a Control center of the supplier
15b Mobile data collector
15c Stationary concentrator

The invention claimed is:

1. A communication module for an acquisition of consumption data of a meter, wherein the communication module serving to receive the consumption data from the meter and to enable a transmission of the consumption data of the meter to a superordinate data collection apparatus, the communication module comprising:
   a housing;
   a controller,
   an energy source integrated within said housing of the communication module:
   at least one antenna:
   a first communication interface via which the consumption data can be transmitted from the meter to the communication module;
   a second communication interface via which the consumption data can be further transmitted from the communication module to the superordinate data collection apparatus;
   said first communication interface is a wireless close-range interface for wireless connection to the meter, which supports a first plurality of transmission protocols as options, and that said second communication interface is a long-range interface supporting a second plurality of the transmission protocols as options;
   a data memory for storing the consumption data;
   said at least one antenna is provided for communication using said first communication interface as well as said second communication interface, said at least one antenna being integrated into the communication module, or said at least one antenna having a first antenna for communication using said first communication interface and a second antenna for communication using said second communication interface, wherein said first antenna and said second antenna being integrated into the communication module;
   the communication module supplying the meter with energy over a wireless charging system using one of said first communication interface or said second communication interface;
   the communication module communicating with a plurality of meters and/or the superordinate data collection apparatus and/or other communication modules;
   means for specifying a respective transmission protocol of the first and the second plurality of the transmission protocols, in order to identify a transmission standard or a transmission protocol over which the meter that is to be connected can communicate and the transmission standard is then selected automatically to connect to the meter; and
   said communication module having an interference detection function; and
   a specification of the respective transmission protocol taking place with reference to interference detection, so that frequency channels and/or the first and the second plurality of the transmission protocols with best possible transmission properties are selected.

2. The communication module according to claim 1, wherein said first plurality of the transmission protocols of said first communication interface include at least two transmission protocols of said first plurality of the transmission protocols selected from a group consisting of: Near Field Communication; Infrared; Infrared Data Association; Bluetooth; Bluetooth Low Energy; Open Metering System; and Inductive transmission.

3. The communication module according to claim 1, further comprising a third communication interface via which the consumption data can be transmitted from the meter to the communication module.

4. The communication module according to claim 3, wherein said third communication interface is a non-standardized close-range and/or a non-standardized long-range interface that supports at least one or, optionally, a plurality of non-standardized transmission protocols.

5. The communication module according to claim 1, wherein said at least one antenna is one of a plurality of antennas.

6. The communication module according to claim 1, wherein said at least one the antenna is one of a plurality of antennas integrated into the communication module.

7. The communication module according to claim 1, wherein the consumption data includes consumption quantities of electricity, gas, water or heat.

* * * * *